United States Patent

Jaccodine

[15] 3,693,251

[45] Sept. 26, 1972

[54] METHOD OF FORMING CLOSELY SPACED CONDUCTIVE LAYERS

[72] Inventor: Ralph James Jaccodine, Allentown, Pa.

[73] Assignee: Bell Telephone Laboratories, Incorporated, Berkeley Heights, N.J.

[22] Filed: Dec. 3, 1970

[21] Appl. No.: 94,679

[52] U.S. Cl. ....................................................29/625

[51] Int. Cl. ........................................B41M 3/08

[58] Field of Search ............317/101 A, 101 CE, 234; 204/15; 29/577, 590, 625; 117/212, 604

[56] References Cited

UNITED STATES PATENTS

| | | |
|---|---|---|
| 3,352,730 | 11/1967 | Murch, Jr. ................29/625 X |
| 3,366,519 | 1/1968 | Pritchard, Jr. et al...29/625 X |
| 3,311,966 | 4/1967 | Shaheen et al. .............29/625 |

*Primary Examiner*—John F. Campbell
*Assistant Examiner*—Robert Ward Church
*Attorney*—R. J. Guenther and Edwin B. Cave

[57] ABSTRACT

An air isolated crossover is fabricated on an integrated or thin film circuit by first forming on the device surface, along with the conductive metal pattern, metal base pads for the crossover members. The horizontal beam members of each crossover then are formed in the required pattern on a copper foil carrier. Holes are etched through the copper foil at the ends of each beam member and in register with the base pads on the device surface. A resin pattern is formed on the underside of the copper foil for spacing and protective purposes and the preform assembly then is placed, resin side down, on the device surface. A metal plating step then completes the crossover structure by building by the base pads to connect to the ends of the beam members. Finally, the copper foil is dissolved leaving the gold crossover member.

2 Claims, 4 Drawing Figures

INVENTOR
R. J. JACCODINE
BY H.W. Lockhart
ATTORNEY

METHOD OF FORMING CLOSELY SPACED CONDUCTIVE LAYERS

BACKGROUND OF THE INVENTION

This invention relates to a method for making crossover type connectors for integrated semiconductor and thin film circuits.

As integrated circuits and other microelectronic circuits become more complex the use of and need for arrangements of crossover connectors has increased. The problem of providing such crossovers in a reliable form which can be readily fabricated has been approached in numerous ways. One arrangement for providing crossing conductors or connectors in integrated circuits uses "crossunders". Such configurations present problems related to the semiconductor device fabrication itself, inasmuch as the crossunders are constituted by conductivity type zones formed within the substrate material. However, this invention is directed to crossover configurations of the type disclosed in U.S. Pat. No. 3,461,524 to M. P. Lepselter as well as my U.S. Pat. No. 3,597,839.

Generally the crossover type structure involves a considerable number of fabrication steps with the reduction in yield of good devices as a consequence of this large number of steps, each of which may involve error. Where fabrication of the crossover involves direct structural modification of the integrated or thin film circuit, error at some stage of the crossover fabrication results in discarding of the entire circuit which otherwise may have been satisfactory.

Accordingly, an object of this invention is a process for fabricating a crossover utilizing a preform member upon which most of the fabrication steps, such as pattern delineation, are performed and which, in the case of error, may then be discarded. Thus, the process offers the possibility of retrieving the device while discarding the preform rather than discarding the almost-completed device as in most prior art practice.

SUMMARY OF THE INVENTION

In accordance with this invention metal base pads for crossovers of the air isolated type are formed simultaneously with the final metallization pattern for the integrated or thin film circuit. Such metal base pads adjoin the conductors on the integrated circuit device over which it is desired to form a crossover connector. Then, using a sheet of metal foil as a carrier, a preform is fashioned having metal crossover beams, typically gold, formed on one face of the foil by photolithographic and metal deposition techniques. On the underside of the metal foil carrier there is formed a pattern of resin which, with the foil thickness, provides the spacing means which determines the separation between the crossing conductors. The resin also may function as an adhesive during fabrication and as a permanent protective coating. Also, by means of photomasking techniques, holes are etched through the metal foil carrier at the ends of the crossover beams, the holes being in registration with, and matching the dimensions of, the metal base pads already formed on the device surface.

The preform member then is placed on the device surface with the etched holes in the metal foil carrier matching the metal base pads and with the resin layer on the underside providing the spacing means for the foil and thus, for the crossover beam, from the device surface. The remainder of the upper face of the metal foil carrier not occupied by crossover beams remains covered with a film of photoresist. A metal plating operation then builds up metallization from the base pads to join them to the horizontal crossover beam members. Finally, the photoresist and metal foil carrier are selectively dissolved leaving simply the crossover member with air and resin isolation from the underlying crossing connection.

BRIEF DESCRIPTION OF THE DRAWING

The invention and its objects and features will be more clearly understood from the following detailed description taken in conjunction with the drawing in which.

DETAILED DESCRIPTION

Figure 1:
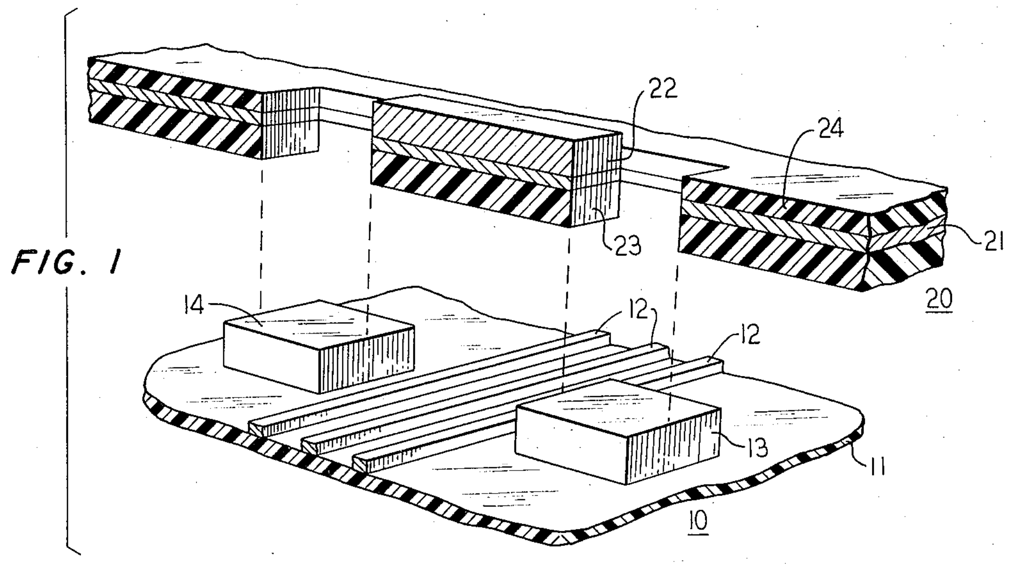
FIGS. 1 through 4 show schematically in perspective and partial cross section the sequence of steps of applying the copper foil carrier preform to a portion of a circuit member for the fabrication of a crossover member.

Referring to FIG. 1 a portion of a thin film circuit device 10 is shown having metallized portions on an insulating board 11. Three parallel metal conductors 12 traverse the center of the board and are flanked by gold metal base pads 13 and 14 upon which a crossover will be formed. The conductors 12 form parts of interconnecting circuits, not shown, to active or passive devices. Similarly, metal base pads 13 and 14 constitute terminations of circuit connectors, not shown, which may approach the base pads from any direction, with the exception of that of the adjoining crossing conductors 12.

The crossover member is formed using the preform 20 depicted in registration position over the circuit portion 10. The preform 10 comprises a copper foil carrier 21 having on the upper face thereof a horizontal beam member 22, typically of gold. This horizontal beam member 22 as well as an array of other beam members are formed on the upper face of the copper foil by a photoresist and metal deposition technique. For the sake of simplicity and clarity of explanation only a single horizontal beam member for one crossover member is illustrated.

In the next step using a second photoresist pattern 24 as a definition means, holes are etched through the copper foil at the ends of the beam member 22. These holes correspond in size and location, as suggested by the broken lines connecting the members 10 and 20, to the metal base pads 13 and 14.

Fabrication of the preform 20 is completed by forming on the underface of the copper foil 21 a matching pattern composed of a resin layer 23. This resin layer 23 constitutes the spacing means for holding the metal carrier and horizontal beam member 22 off of the crossing connectors 12 on the circuit board surface. It may also serve as protective film as well.

Figure 2:
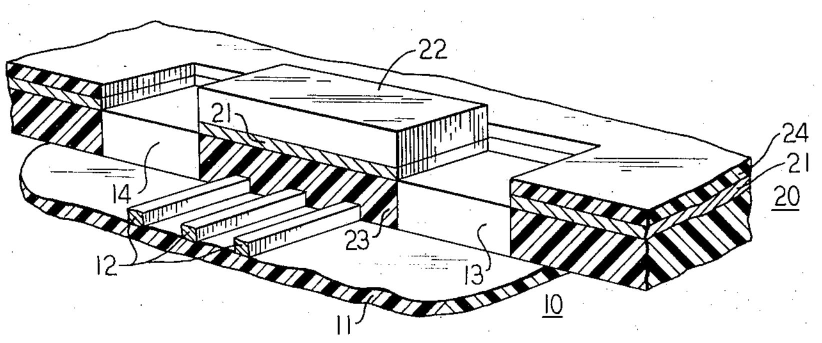
Figure 3:
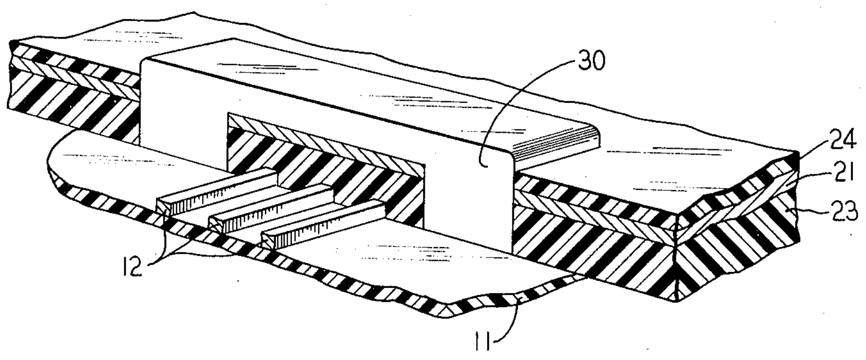

Next, as shown in FIG. 2, the preform 20 is placed on the surface of the circuit portion 10 so that the holes through the preform at the ends of the horizontal beams match the base pads 13 and 14. The resin layer 23 rests on the surface of the crossing conductors 12 and insures spacing between the ultimately formed crossover and the connectors. The assembly then is placed in a plating bath, which may be of the chemical displacement type or may be an electroplating operation using gold. As a result of this operation the crossover member is formed by a build up of gold from the base pads 13 and 14 to a level which connects them solidly to the crossover beam member 22 so as to form the completed crossover 30 as shown in FIG. 3.

Figure 4:
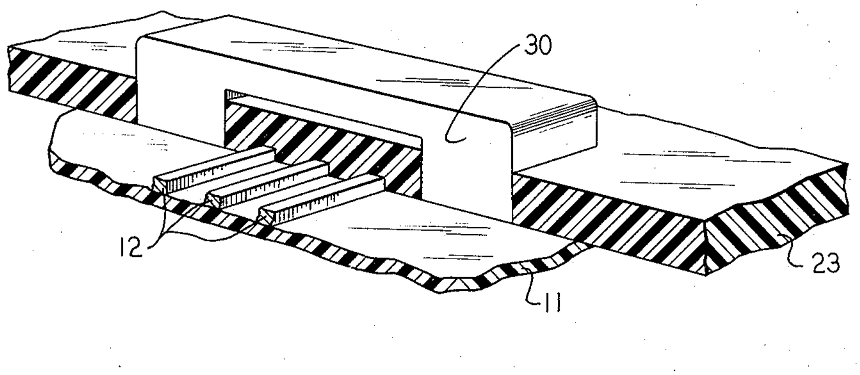

In FIG. 4 the fabrication process is shown after dissolution of the copper foil carrier 21 and the photoresist film 24. Strippers for photoresist coatings are well known, as are solvents for the copper foil such as, for example, ferric chloride and nitric acid. The selection of a suitable solvent is within the skill of the art and governed by the presence of other materials which may be susceptible to the action of such solvents.

In a specific example in accordance with the invention a preform member was formed based on a carrier 21 of copper foil having a thickness of 0.7 mil. Foils ranging in thickness from about 0.5 to 1.5 mils are suitable. Using a standard photolithographic process a gold crossover beam member 22 having a thickness of about 0.1 mil was formed by gold plating on a photomask. The foil carrier was remasked using photoresist to delineate the openings through the copper foil carrier at each end of the crossover beam member 22. The holes were etched using a standard ferric chloride etchant. Then, on the underside of the foil carrier the resin pattern was formed using silicone having a thickness of about 0.3 to 0.7 mil.

The preform was placed down on the circuit board with the holes through the carrier in registration with the metal base pads 13 and 14. Advantageously, the resin is in a tacky condition and acts as a glue to adhere the preform assembly to the device surface. The assembly was placed in a plating bath for a period of about 90 minutes after which the gold had built up to connect the crossover member 22 with the base pads 13 and 14. The bath was a standard potassium gold cyanide solution with citrate buffer.

Although the invention has been disclosed in terms of certain specific materials it will be understood that other suitable materials may be employed to practice the method. For example, as an alternative to copper as the carrier member, other metals such as iron, nickel and molybdenum may be used. Also, other compatible resin type materials may be employed for the spacing layer 23 on the underside of the carrier.

In an alternative embodiment a virtual preform is used by applying a layer of resin to the slice in completed form except for crossovers. A metal film then is deposited on the resin and by selective masking and etching, horizontal beam portions are formed on the metal film and deposition windows are etched through both the metal film and resin layer. The crossovers are built up by plating as in the first disclosed embodiment followed by dissolution of unwanted materials likewise.

I claim:

1. A method of fabricating closely spaced conductive layers for crossovers on an integrated circuit device having a conductive metal pattern thereon said method comprising:

a. forming a pair of metal base pads for a crossover on said circuit device, b. fabricating a preform member comprising the steps of forming on a metal foil carrier member the horizontal beam portion for said crossover member, forming openings through said metal foil carrier member at each end of said horizontal beam member and forming a pattern of a resin on the surface of said metal foil carrier opposite that on which said horizontal beam member is formed, c. applying said preform member to the surface of said integrated circuit device so that said openings in said metal foil carrier are in register with said metal base pads, d. depositing metal through said openings in said preform member sufficient to connect said metal base pads to said horizontal beam member, and e. removing said metal foil carrier.

2. The process in accordance with claim 1 in which said preform is fabricated using copper as the metal foil carrier member and in which the openings in said foil and said horizontal beam member are fabricated using photolithographic masking.

* * * * *